(12) United States Patent
Lee et al.

(10) Patent No.: US 9,795,047 B1
(45) Date of Patent: Oct. 17, 2017

(54) ELECTRONIC APPARATUS AND METHOD FOR ASSEMBLING THEREOF

(71) Applicant: Chicony Power Technology Co., Ltd., New Taipei (TW)

(72) Inventors: Po-Sheng Lee, New Taipei (TW); Yu-Jan Lin, New Taipei (TW)

(73) Assignee: CHICONY POWER TECHNOLOGY CO., LTD., New Taipei (TW)

( * ) Notice: Subject to any disclaimer, the term of this patent is extended or adjusted under 35 U.S.C. 154(b) by 0 days.

(21) Appl. No.: 15/272,227

(22) Filed: Sep. 21, 2016

(30) Foreign Application Priority Data

Mar. 30, 2016 (TW) .............................. 105110025 A (51) Int. Cl.
*H05K 1/14* (2006.01)
*H05K 7/14* (2006.01)
*H05K 5/03* (2006.01)
*H05K 5/02* (2006.01)

(52) U.S. Cl.
CPC ......... *H05K 7/1418* (2013.01); *H05K 5/0217* (2013.01); *H05K 5/0247* (2013.01); *H05K 5/03* (2013.01); *H05K 7/1401* (2013.01)

(58) Field of Classification Search
CPC ...... H05K 5/0217; H05K 5/0247; H05K 5/03; H05K 7/1401; H05K 7/1418

USPC ....... 361/737, 728–730, 752, 796, 800, 807, 361/809, 810
See application file for complete search history.

(56) References Cited

U.S. PATENT DOCUMENTS

| | | | | |
|---|---|---|---|---|
| 5,272,934 A | * | 12/1993 | Chegash | ................. F16C 1/105 24/136 L |
| 5,553,818 A | * | 9/1996 | Wild | ................... B60R 16/0222 248/56 |
| 6,449,164 B1 | * | 9/2002 | Gershfeld | ............ H05K 5/0039 174/50 |
| 7,128,598 B2 | * | 10/2006 | Ebert | ................. H01R 13/5812 439/445 |

\* cited by examiner

*Primary Examiner* — Hung S Bui
(74) *Attorney, Agent, or Firm* — Chun-Ming Shih; HDLS IPR Services (57) ABSTRACT

An electronic apparatus includes a case, an integrated circuit module, a cable and a fastener component. The case includes an opening and an accommodating space for the integrated circuit module and the fastener component installed therein. The cable is passed through the opening to be electrically connected with the integrated circuit module. The fastener component is adjacent to the opening and includes a first fastening portion and a second fastening portion for fastening the conducting cable and the circuit module respectively. Thereby, the cable and the integrated circuit module will be fastened simultaneously through the fastener component, and a one-time ultrasonic welding process is applied for assembly, thus the process will be simplified as to improve the yield rate.

12 Claims, 14 Drawing Sheets

ELECTRONIC APPARATUS AND METHOD FOR ASSEMBLING THEREOF

BACKGROUND OF THE INVENTION

Field of the Invention

The present invention generally relates to an electronic apparatus and, in particular to a power adapter in which the cable and the circuit board will be fastened simultaneously and a method for assembling thereof.

Description of Prior Art

With the progress of the times, industry designs of electronic products have been developed in a way of good appearance, high reliability and high performance. For designing the housings of conventional power products, in order to meet the requirements of molds and processes, a circuit board needs to be assembled in the housing, then two sides of the housing are combined with two side covers by a method of ultrasonic welding for a closed combination. Lastly, a cable passes through one side cover providing with an opening for electrically connected with the circuit board.

However, a traditional method of assembling needs at least two processes of ultrasonic welding for jointing the housing and the side covers. Nevertheless, ultrasonic welding is an irreversible process, that is, it cannot be recovered when finished; in other words, there is no chance for rework. As a result, a controlling of quality must be particularly noticed when this kind of process is adapted, otherwise, abandonment will be the only way when something is wrong during the welding processes. At last, a yield of the overall process will be lowered, and a long working hour is happened because of a complicated manufacturing process. Moreover, with the improvement of the works, it has a significant effect on good appearance of power products, especially seamless design of products. Thus, how to improve the aforementioned shortcomings and get an integrated design of power products for satisfying safety requirements of testing are major objects of the inventor.

SUMMARY OF THE INVENTION

Accordingly, an object of the present invention is to provide an electronic apparatus, in which the cable and the integrated circuit module are fastened separately by a fastener component, and an ultrasonic welding process is adapted to perform the assembly for simplifying the process and improving the yield rate.

In order to achieve the object mentioned above, the present invention provides an electronic apparatus including a case, an integrated circuit module, a cable and a fastener component. The case has an accommodating space, and one side of the case has an opening. The integrated circuit module is disposed in the accommodating space. The cable is inserted in the opening and electrically connected with the integrated circuit module. The fastener component is disposed in the accommodating space and adjacent to the opening. The fastener component comprises a first fastening portion and a second fastening portion. The first fastening portion connects and secures the cable, and the second fastening portion connects and secures the integrated circuit module.

In order to achieve the object mentioned above, the present invention provides a method for assembling an electronic apparatus. The electronic apparatus comprises a case having an opening, an integrated circuit module, a cable and a fastener component. The method of assembling includes: passing the cable out from the opening of the case; securing the cable and the integrated circuit module with the fastener component separately; and locating the fastener component to be inside of the accommodating space and to be fastened at a position adjacent to the opening.

In an embodiment of the present invention, wherein an inner peripheral wall of the case is provided with a guiding rail, and the fastener component is provided with a guiding bump; the fastener component is moved to the accommodating space through an engagement of the guiding bump and the guiding rail, thus the fastener component is located to be adjacent to the opening.

In an embodiment of the present invention, wherein the case is provided with a limiting rack disposed in the accommodating space adjacent to the opening, and the limiting rack is provided with at least one limiting hole; the fastener component has at least one limiting block, and the fastener component is fastened adjacent to the opening of the case through the limiting block retained by the at least one limiting hole.

In an embodiment of the present invention, wherein the case includes a main housing and at least one side cover, and the method of assembling further includes combining the at least one side cover with the main housing by ultrasonic welding for forming a closed configuration after the fastener component being fastened at the position adjacent to the opening of the case.

The present invention also has the following effects. The overall strength of the product can be improved by the case which is integrally formed, and an ultrasonic welding process is applied only in one side of the case for simplifying the manufacturing process and improving a yield. In addition, components of the product disposed inside the case are fastened firstly before assembling in the case that a reliability of the product can be improved. Moreover, the integrated circuit module can be supported and fixed at multi sides by the designed structures of the fastener component and the case, even the product the product has been impacted by a drop, the integrated circuit module will not be detached easily so that it can meet the safety regulatory requirements.

BRIEF DESCRIPTION OF DRAWING

The features of the invention believed to be novel are set forth with particularity in the appended claims. The invention itself, however, may be best understood by reference to the following detailed description of the invention, which describes a number of exemplary embodiments of the invention, taken in conjunction with the accompanying drawings, in which:

DETAILED DESCRIPTION OF THE PREFERRED EMBODIMENTS

In cooperation with attached drawings, the technical contents and detailed description of the invention are described thereinafter according to a number of preferable embodiments, being not used to limit its executing scope. Any equivalent variation and modification made according to appended claims is all covered by the claims claimed by the present invention.

Figure 1:
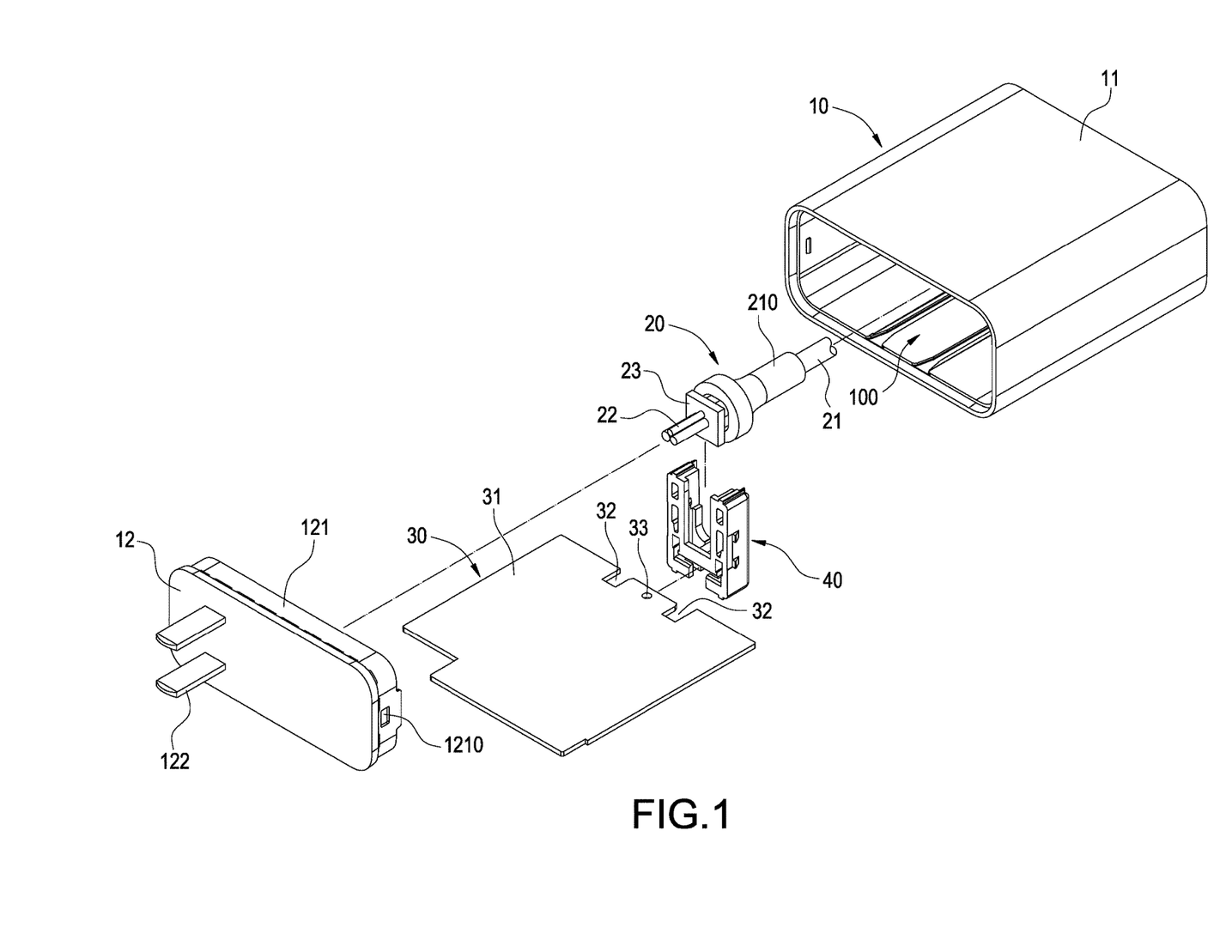
FIG. 1 is a perspective schematic view of an electronic apparatus of the present invention.
Figure 2:
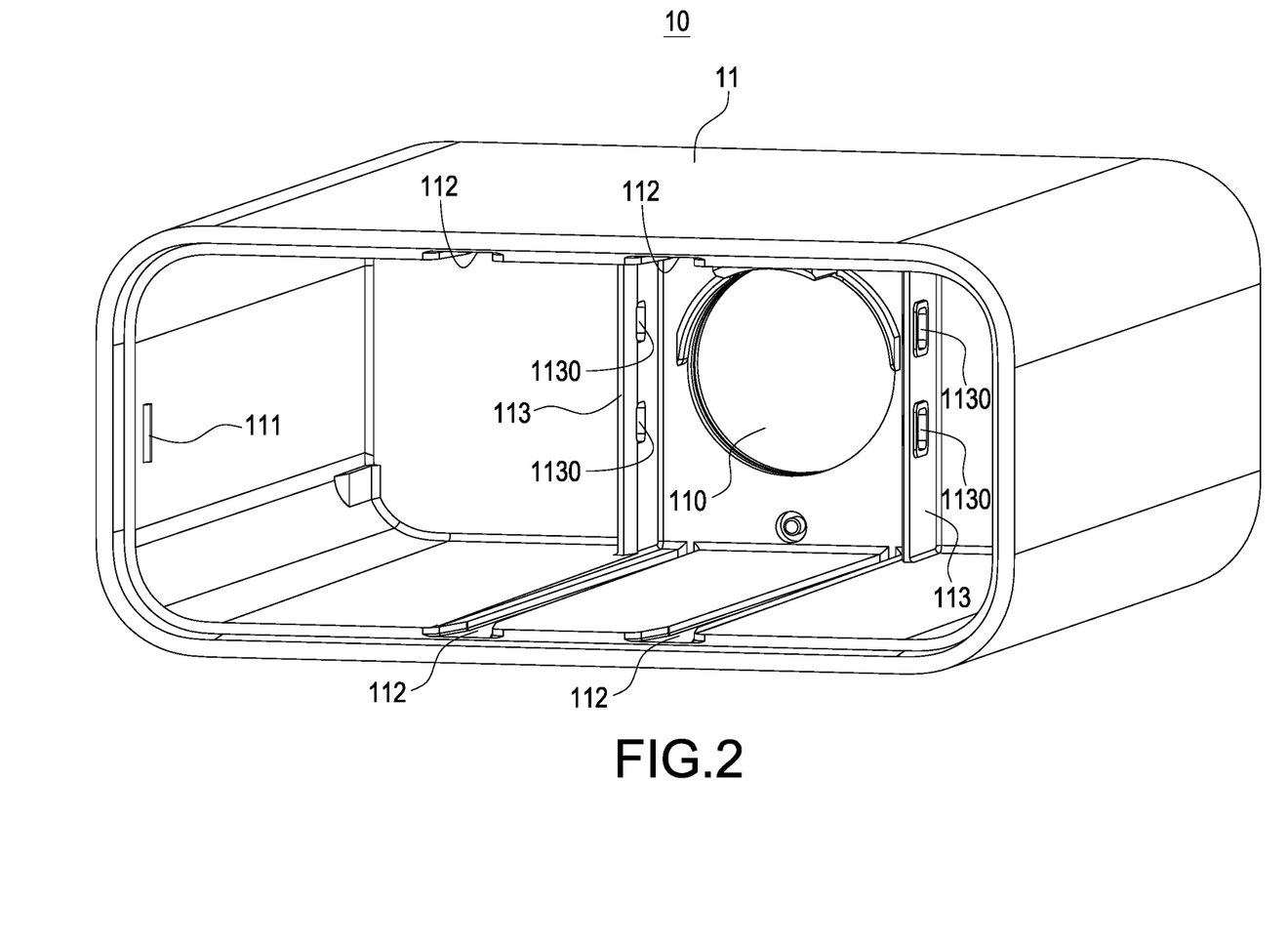
FIG. 2 is a perspective view of the main housing of the present invention.

Please refer to FIG. 1 and FIG. 2. The present invention provides an electronic apparatus and a method for assembling thereof. The present embodiment will describe the electronic apparatus of the present invention in detail firstly, and describe the method for assembling the electronic apparatus later in detail. The electronic apparatus of the present invention includes power connectors or power adapters applied in all kinds of electronic products. The electronic apparatus includes a case 10, a cable 20, an integrated circuit module 30 and a fastener component 40.

The case 10 is a cylindrical housing having an accommodating space 100. The cylindrical housing can be configured in a straight cylindrical structure or an L-shaped tubular structure, and a cross section of the tubular structure can be a rectangle, a circle, an oval or in an oblate shape that will be determined according to designing requirements for different electronic products. The case 10 includes a main housing 11 and at least one side cover 12. In the present embodiment, the main housing 11 is, but not limited, integrally formed with one open side combined with the at least one side cover 12. In real practice, the main housing 11 can be provided with two open sides coupling with two side covers 12, wherein the main housing 11 and the at least one side cover 12 are combined by ultrasonic welding, and the assembling method is described in the following.

As mentioned above, the main housing 11 has a buckle part 111 provided in an inner wall near the open side symmetrically and has an opening 110 provided on a side surface opposite to the open side. Besides, at least one guiding rail 112 is disposed symmetrically in an inner wall and extended from the open side to be adjacent the opening 110. The width of the at least one guiding rail 112 is wider in an end near the open side that forms a tapered width. In more detail, although figures show that two guiding rails 112 are disposed symmetrically on the inner wall, the quantity of the guiding rails 112 is not limited to two. In addition, limiting racks 113 are disposed symmetrically adjacent to the opening 110, and each limiting rack 113 is provided with at least one limiting hole 1130.

The shape and dimensions of the at least one side cover 12 are consistent with the open side of the main housing 11, and a cover-wall 121 is provided corresponding to the open side. The cover-wall 121 has a buckle hole 1210 for engaging with the buckle part 111 of the main housing 11. Moreover, a plugging member 122 is disposed on an opposite side of the cover-wall 121 that can be applied, but not limited to, in a form of a household AC power plug pins or a USB male connector for an electronic product, wherein the integrated circuit module 30 is disposed in the accommodating space 100, and the cable 20 is inserted in the opening 110 for electrically connecting with the integrated circuit module 30.

Please refer to FIG. 3 to FIG. 7. The fastener component 40 is a seat 41 with a recess 410 and disposed in the accommodating space 100 at a location adjacent to the opening 110 of the main housing 11. The seat 41 has a first fastening portion 42 and a second fastening portion 43, wherein the first fastening portion 42 is a notch structure and formed on a side of the seat 41 closer to the opening 110. Furthermore, the first fastening portion 42 includes a front notch 420, a separating block 421, a first positioning block 422 and a rear notch 423. The separating block 421 is disposed between the front notch 420 and the rear notch 423 to form a partition, and the first positioning block 422 is provided in a wall of the seat 41 corresponding to the front notch 420.

As mentioned above, the second fastening portion 43 is a notch and formed on a side away from the recess 410 of the seat 41. The second fastening portion 43 includes a supporting arm 431, an inserting slot 432, a second positioning block 433 and an inserting wall 434. The supporting arm 431 is extended from the seat 41 and bent in a direction away the recess 410. Thus the inserting slot 432 is a spacing formed between the supporting arm 431 and the seat 41, and the inserting wall 434 is formed from the inserting slot 432 neighboring the opening 110. The second positioning block 433 is disposed in a wall of the seat 41 between the inserting slot 432 and the inserting wall 434, as shown in the FIG. 6.

Figure 3:
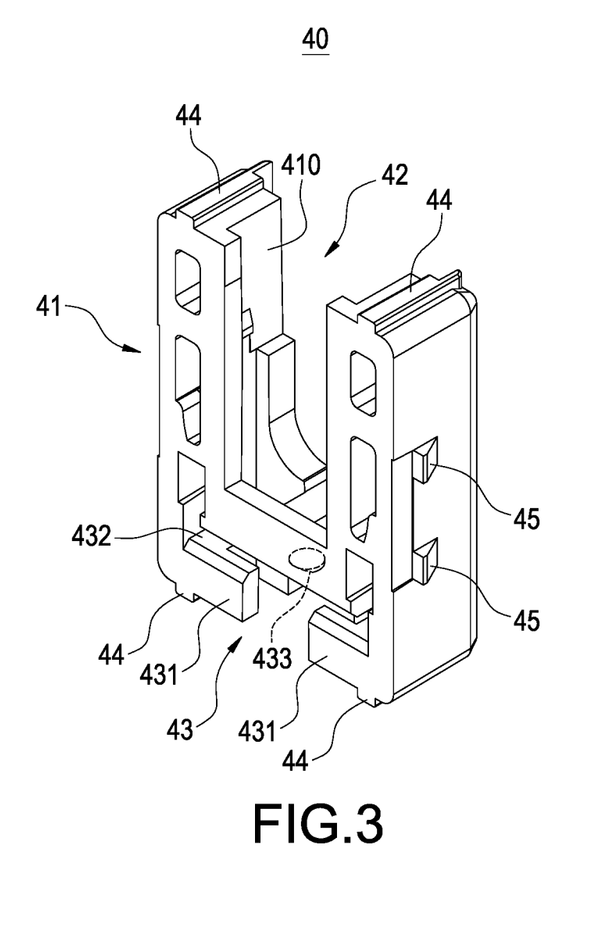
FIG. 3 is a perspective view of the fastener component of the present invention.

The seat 41 further includes at least one guiding bump 44 and a limiting block 45. There are two guiding bumps 44 disposed at a side and its corresponding side of the seat 41 away from the inserting slot 432 separately and protruded outwardly. In more detail, these guiding bumps 44 are formed at two corresponding sides (up and down sides) of the seat 41 and extended form the front side to the back side of the seat 41. Moreover, the limiting blocks 45 are disposed at left and right sides of the seat 41 separately; though two limiting blocks 45 are shown in figures, the quantity of the limiting blocks 45 is not limited. The first positioning block 422, the second positioning block 433 and the limiting block 45 are bumps with inclined planes at corresponding surfaces of the seat 41. The first positioning block 422 is a bump with an inclined plane protruded from the up to the down sides of the seat 41; the second positioning block 433 is a bump with an inclined plane protruded from the front to the back sides of the seat 41; the limiting blocks 45 is a bump with an inclined plane protruded from the back to the front sides of the seat 41. In further, the above mentioned up, down, left, right, front and back sides are used for describing the deposed locations and directions of the first positioning blocks 422, the second positioning blocks 433, the guiding bumps 44 and the limiting blocks 45 and are not limited the directions of the seat 41 or accommodating space 100, wherein the bump with an inclined plane can be, but not limited to, an arcuate ramp or a flat ramp.

Figure 4:
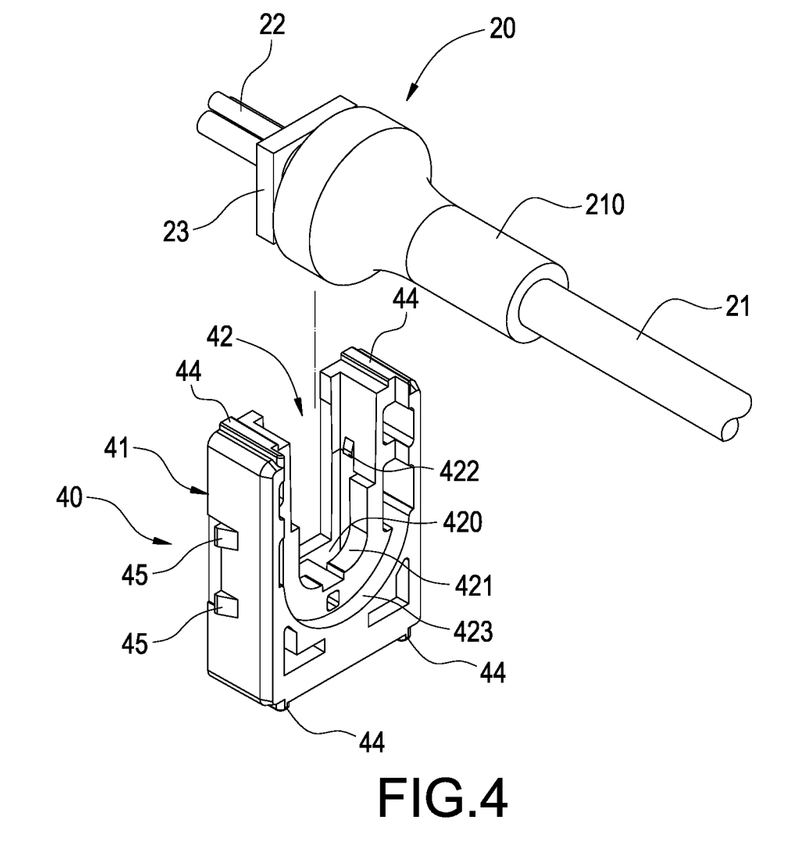
FIG. 4 is a perspective explosion view of combining the fastener component and the cable of the present invention.
Figure 6:
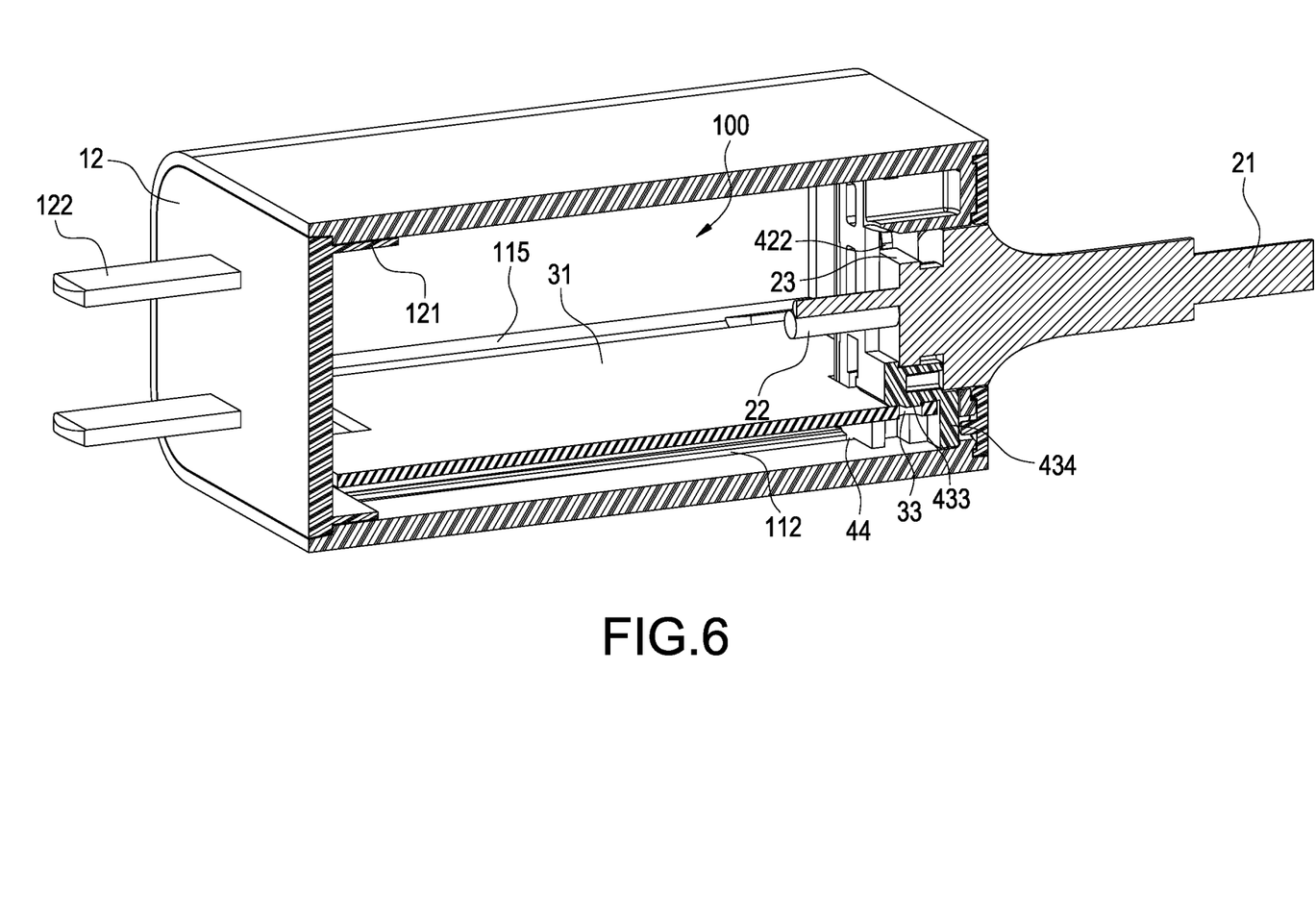
FIG. 6 is a cross sectional view of the electronic apparatus of the present invention.
Figure 7:
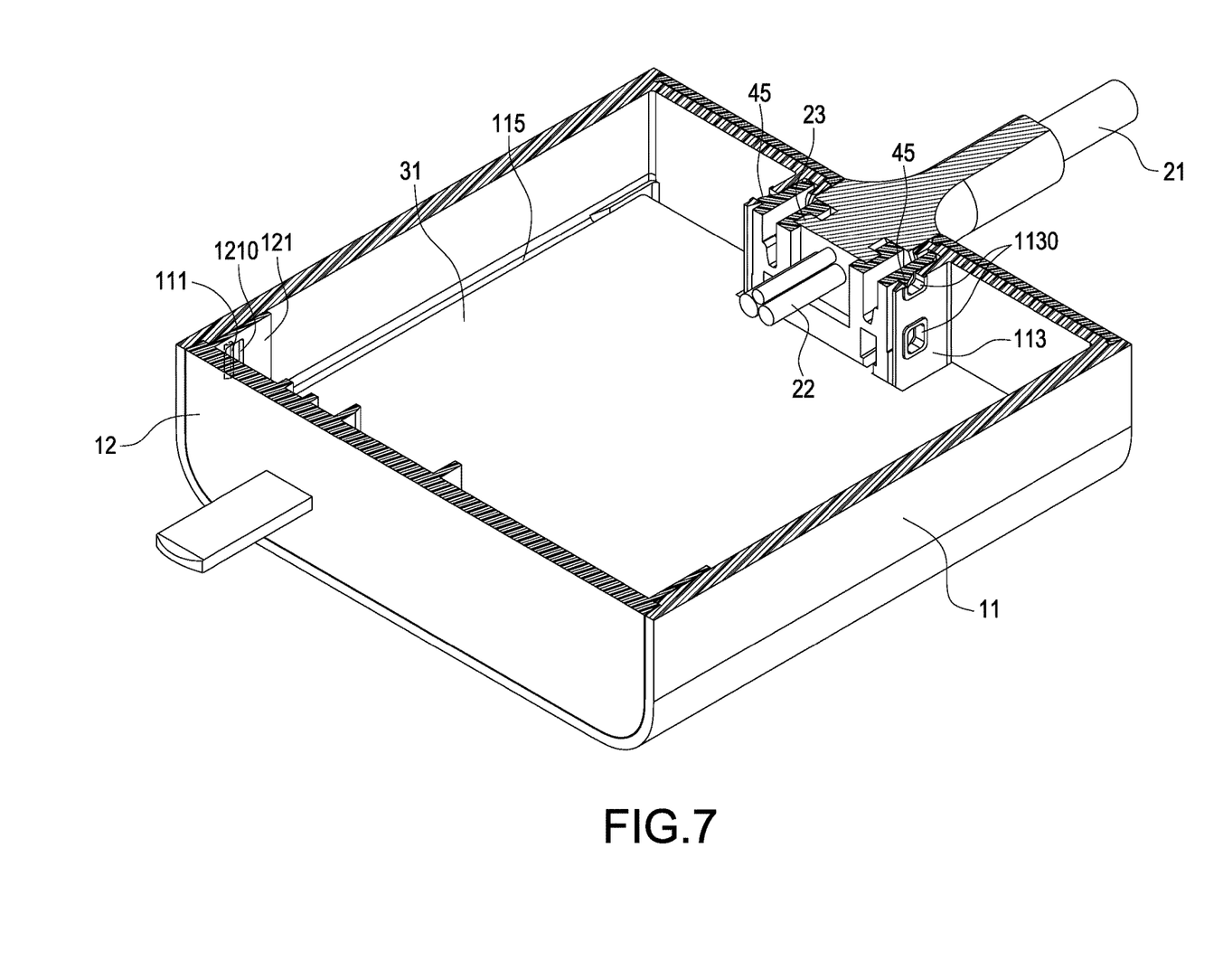
FIG. 7 is another cross sectional view of the electronic apparatus of the present invention.

A cable 20 of a power adapter includes a line body 21 and a connection portion 22. The connection portion 22 is used for electrically connected with the integrated circuit module 30. At the joint of the line body 21 and the connection portion 22, a protecting housing 210 is provided for covering the line body 21 to avoid that inner metal wires may be broken at the joint due to frequent or excessive bending. The cable 20 of the present invention further includes a positioning plate 23, and the positioning plate 23 is disposed between the protecting housing 210 and the connection portion 22, wherein a contour configured from the positioning plate 23 to the protecting housing 210 is in accordance with the first fastening portion 42 of the fastener component 40 for fastening the cable 20. In more detail, the positioning plate 23 and the protecting housing 210 are embedded in the front notch 420 and rear notch 423 from an upper side of the seat 41. The connection portion 22 is stretched out of the recess 410, and the first positioning blocks 422 abuts against the positioning plate 23 in the front notch 420 for fastening the cable 20, as shown in FIG. 4 and FIG. 6.

Figure 5:
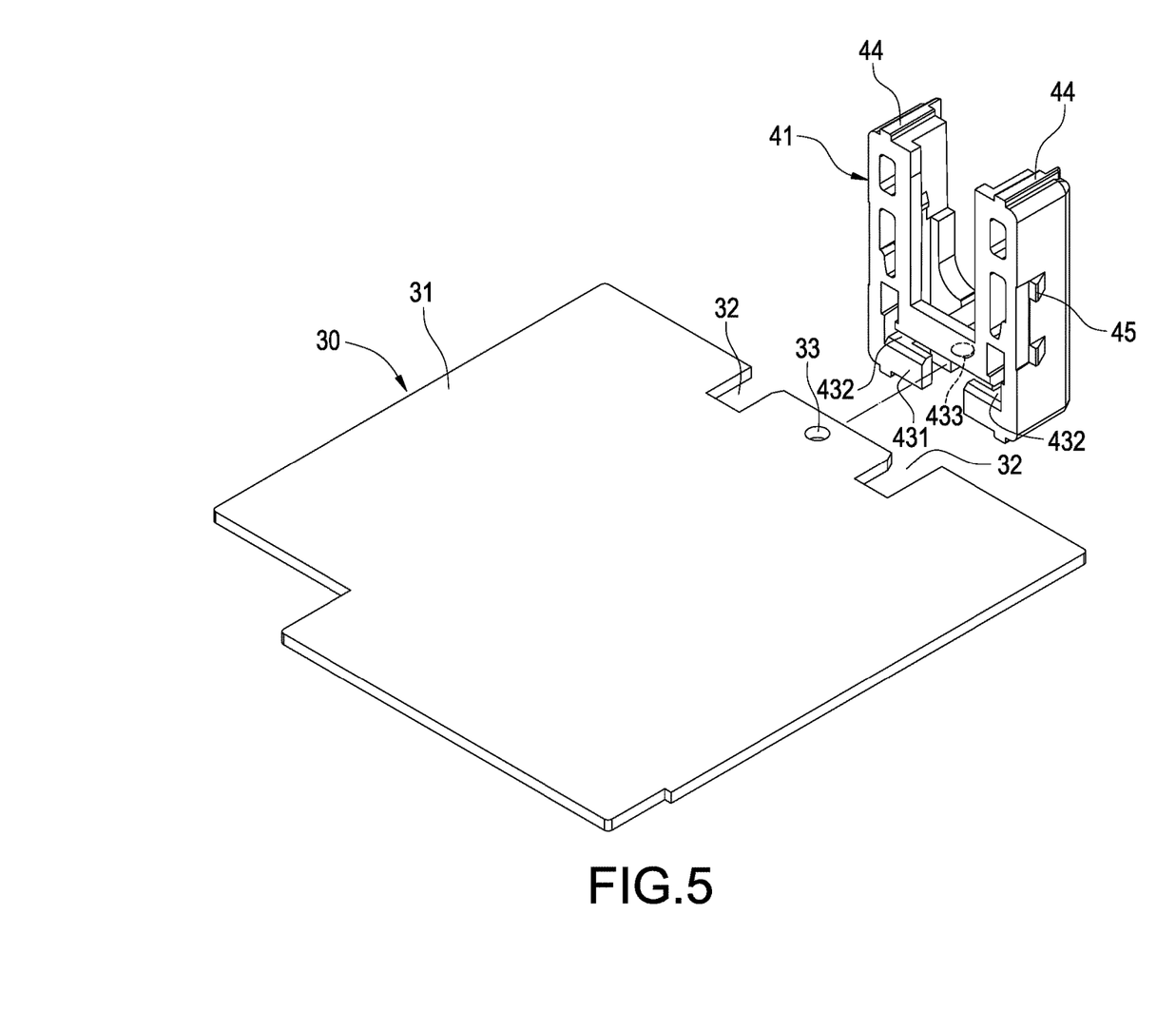
FIG. 5 is a perspective explosion view of combining the fastener component and the integrated circuit module of the present invention.

One side of a circuit board 31 of the integrated circuit module 30 has provided with at least one trough 32 and at least one positioning hole 33. Although two troughs 32 and one positioning hole 33 are presented in the figures and designed for fitting with the second fastening portion 43 of the fastener component 40, the quantity of the troughs 32 and the positioning hole 33 are not limited. The side having the at least one trough 32 and the at least one positioning hole 33 of the circuit board 31 is embedded in the inserting slot 432, wherein the side of the circuit board 31 is abutted against the inserting wall 434, or the bottom of the at least one trough 32 is abutted against the front wall of the seat 41, or neither of above mentioned is abutted and that, but not limited, a clearance is reserved depending on the actual size of the at least one trough 32. In addition, the second positioning block 433 and the at least one positioning hole 33 are engaged with each other, and the side which the circuit board 31 abutting against the supporting arm 431 is provided as a supporting for securing the circuit board 31. Moreover, the connection portion 22 stretching out of the recess 410 is electrically connected with an output port (not shown) of the integrated circuit module 30 for the fastener component 40 fastening the cable 20 and the circuit board 31 through the first fastening portion 42 and the second fastening portion 43 respectively. In more detail, two inner sides of the main housing 11 can be provided with a loading platform 115 for supporting the whole weight of the integrated circuit module 30.

The fastener component 40 is disposed in a side of the main housing 11 neighboring the opening 110 and located between the limiting racks 113, wherein the guiding bump 44 of the fastener component 40 is movably embedded in the at least one guiding rail 112, and the limiting blocks 45 are engaged with the limiting holes 1130 for restricting the fastener component 40. The at least one side cover 12 is combined with the main housing 11 by the buckle part 111 buckling in the buckle hole 1210. The plugging member 122 are electrically connected with an input port (not shown) of the integrated circuit module 30, and the received power will be transferred through the integrated circuit module 30 and outputted from the cable 20.

Figure 8:
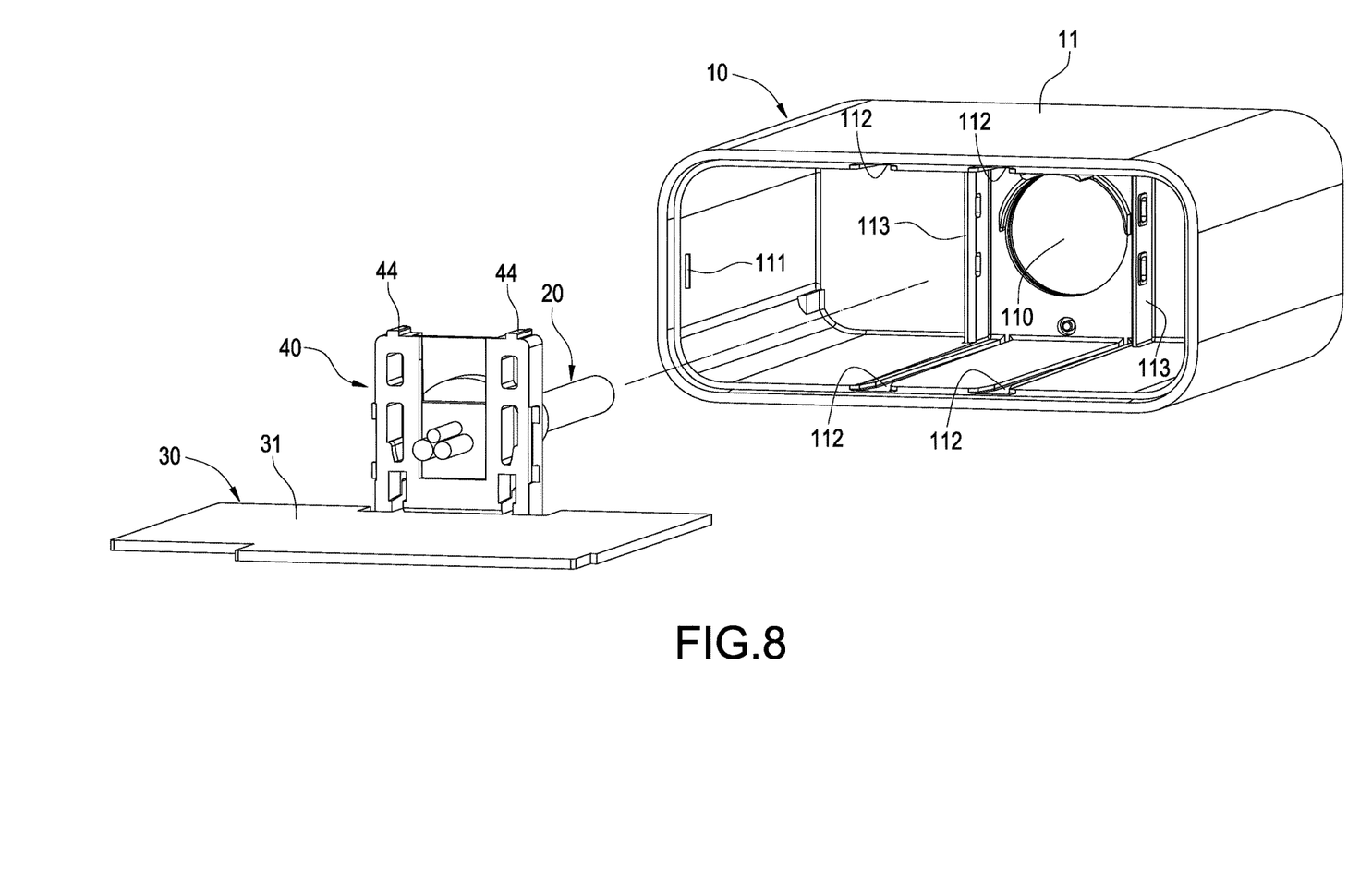
FIG. 8 to FIG. 10 show the processes of a method for assembling the electronic apparatus of the present invention.
Figure 9:
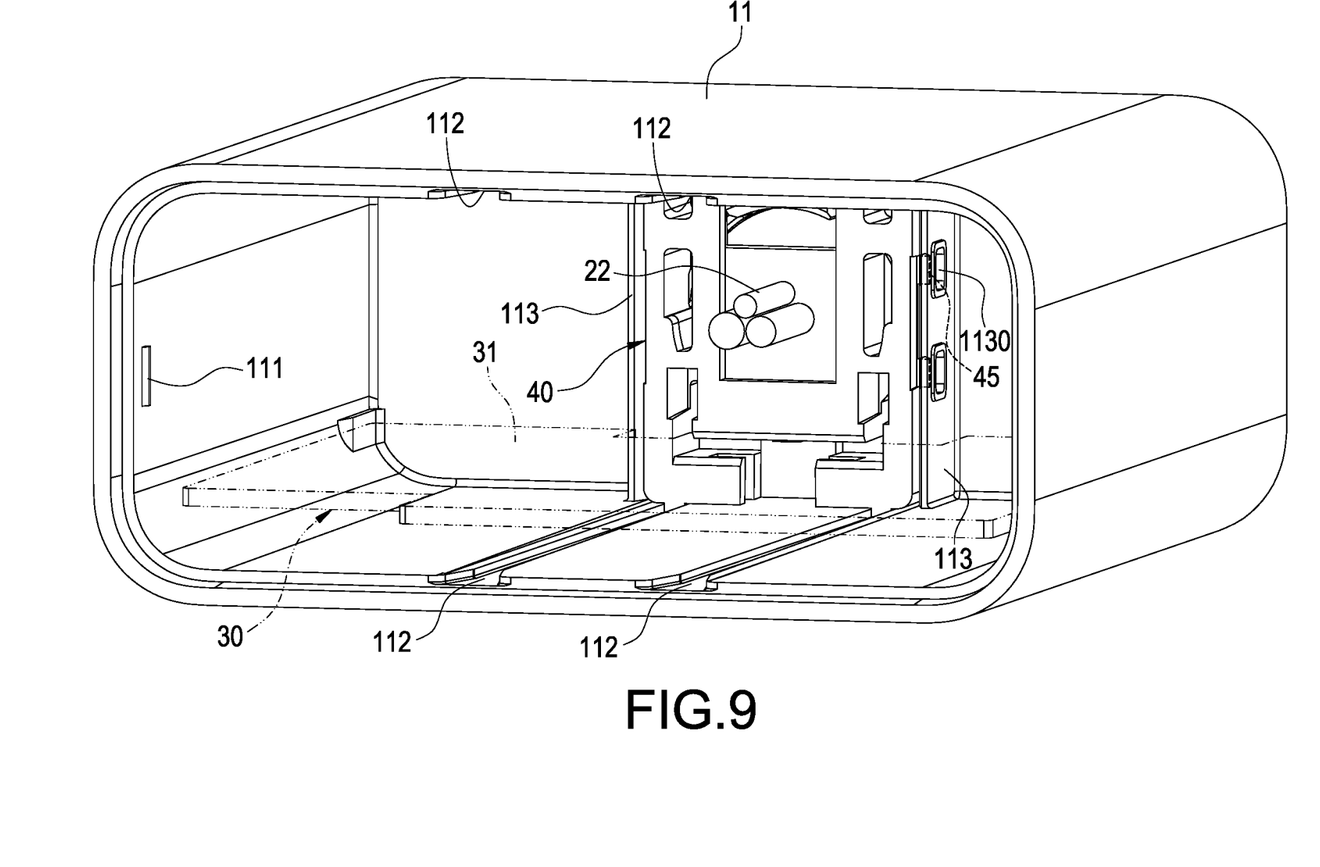
Figure 10:
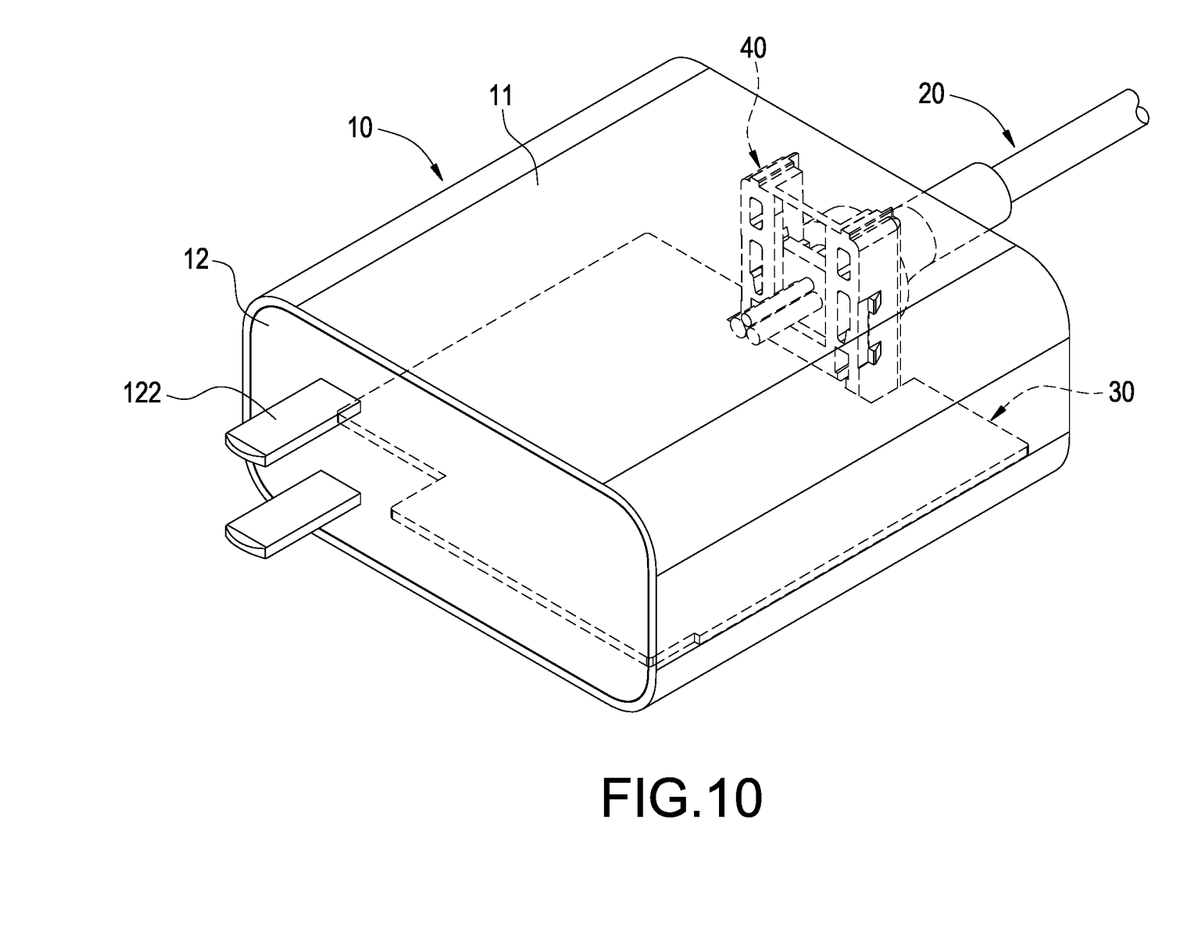
Figure 11:
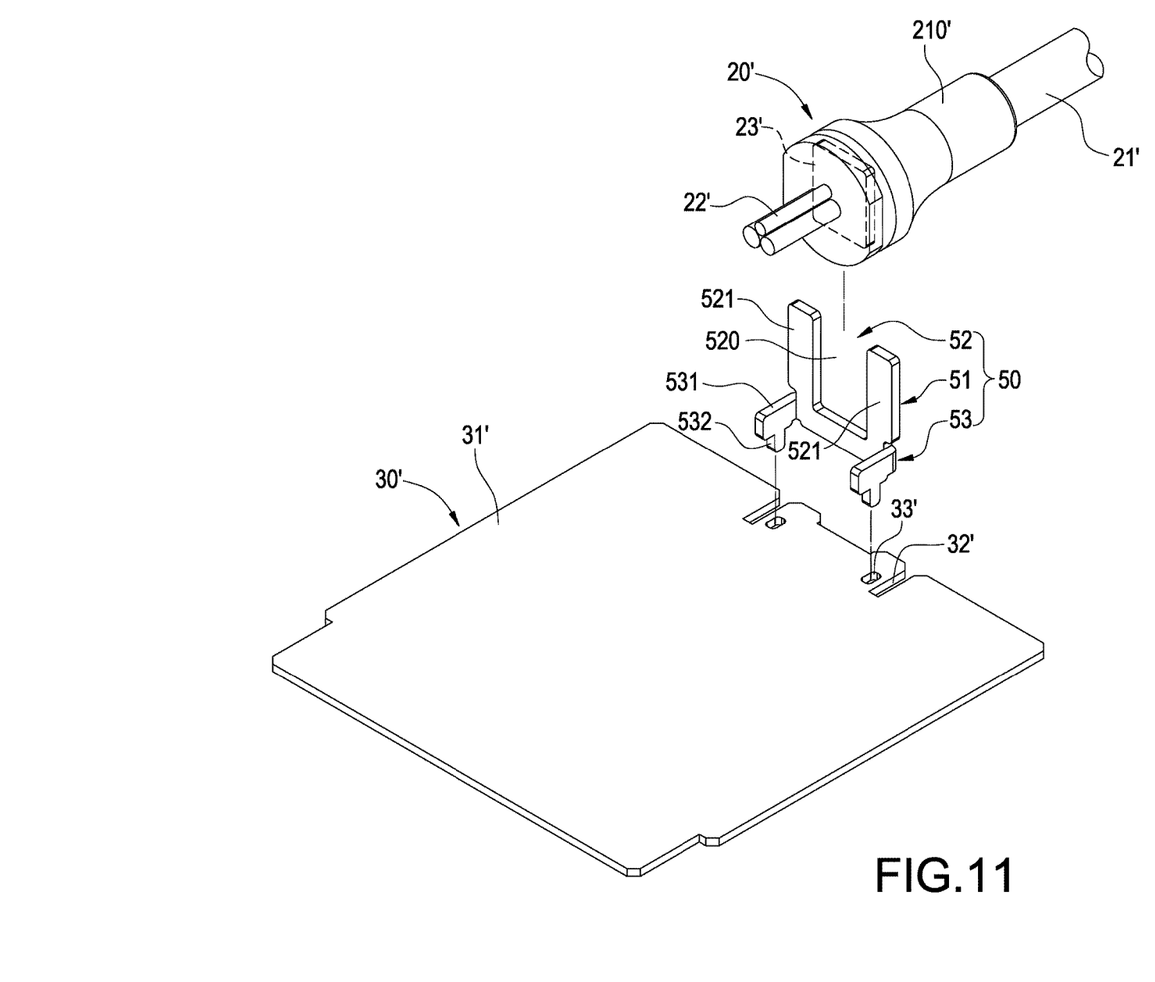
FIG. 11 to FIG. 14 show another embodiment of assembling the electronic apparatus of the present invention.
Figure 12:
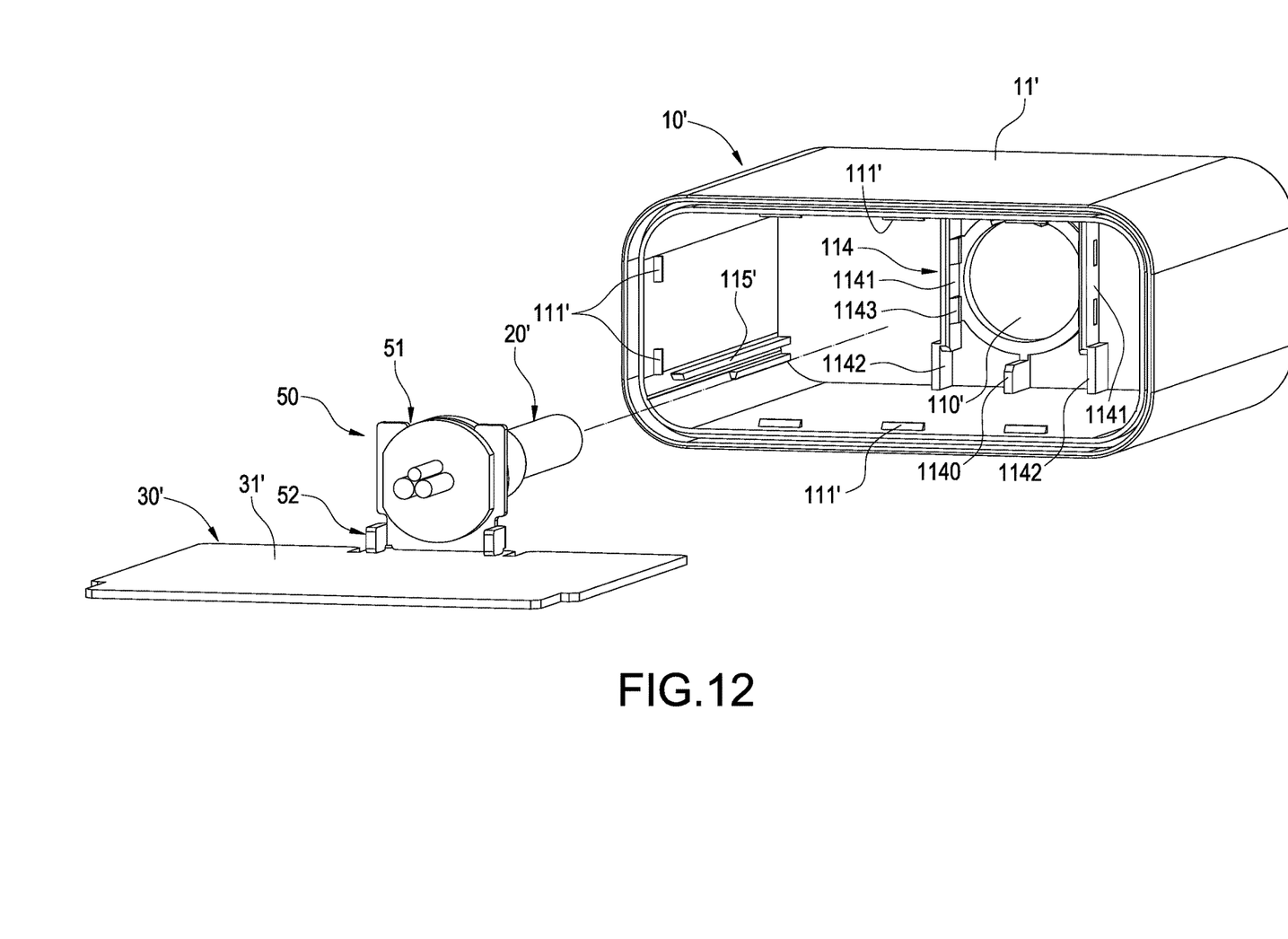
Figure 13:
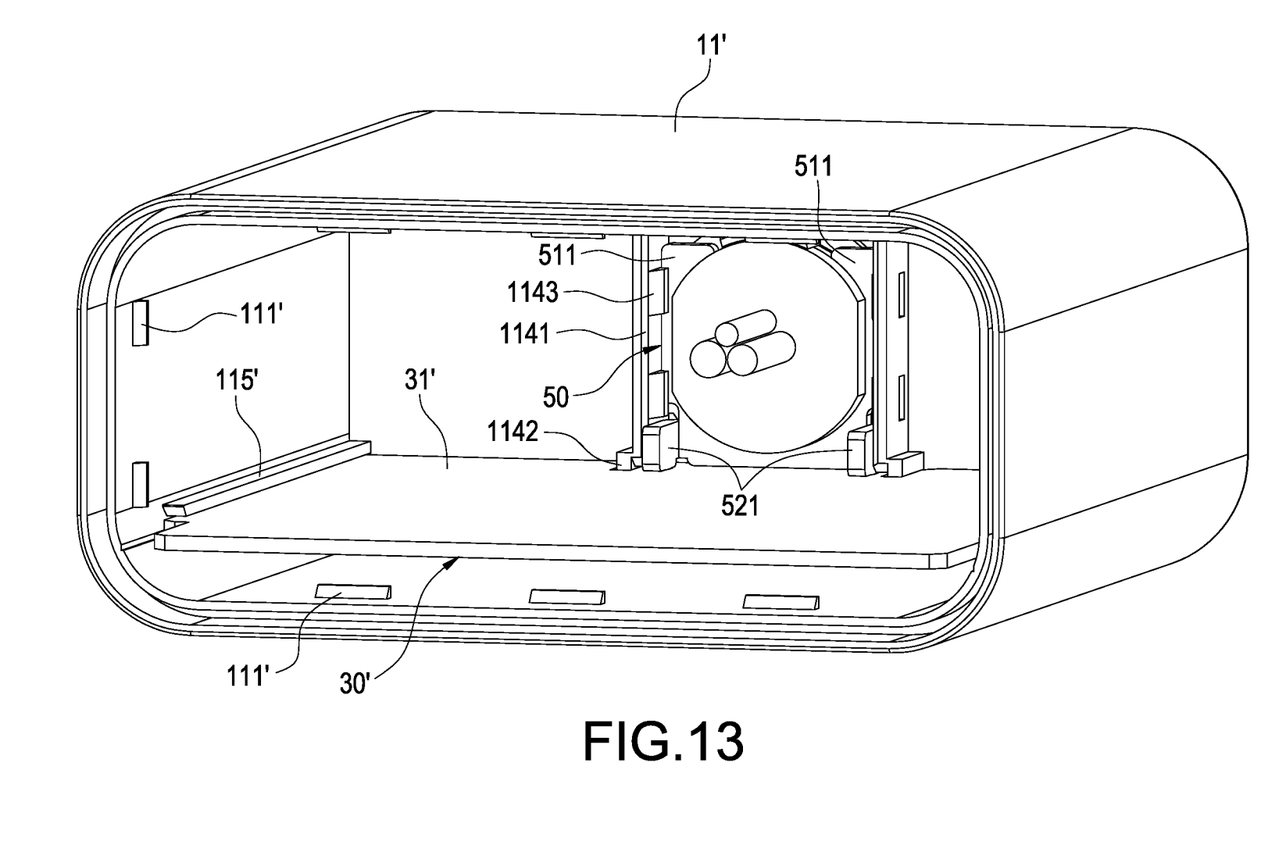
Figure 14:
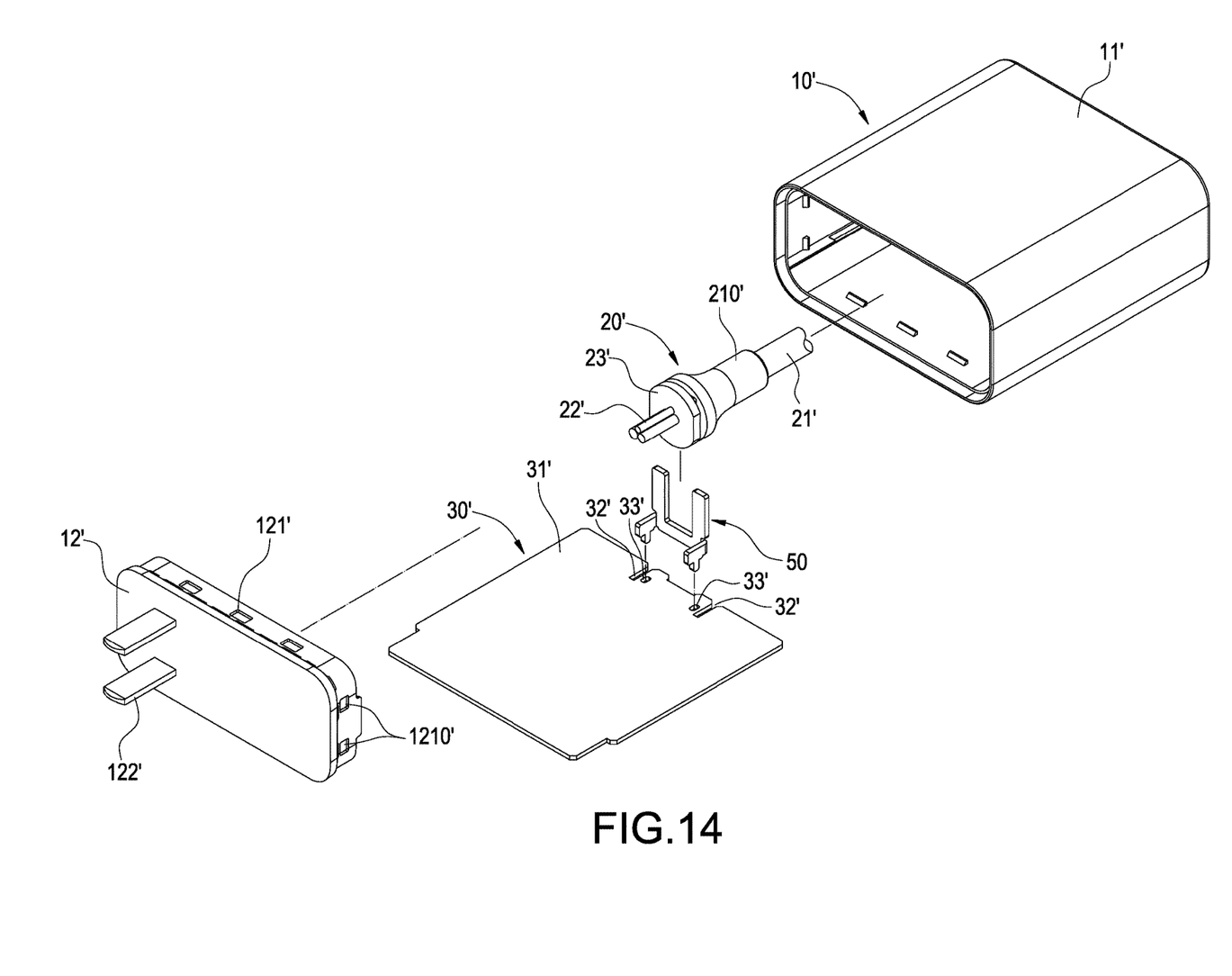

Please refer to FIGS. 1, 8 and 10. The present invention further provides a method for assembling an electronic apparatus, in which the assembling processes of the electronic apparatus are described for solving shortcomings of the prior art effectively. In the present embodiment, one side of the integrated circuit module 30 is fixed on the cover-wall 121 of the at least one side cover 12, and the plugging member 122 are electrically connected with the integrated circuit module 30. The steps of assembling of the present invention are as following:

passing the cable 20 out from the opening 110 of the main housing 11;

securing the cable 20 and the integrated circuit module 30 with the fastener component 40 separately, and electrically connecting the cable 20 with the integrated circuit module 30;

embedding the guiding bumps 44 of the fastener component 40 in the at least one guiding rail 112 separately; moving to a position adjacent to the opening 110 of the main housing 11 along the at least one guiding rail 112 and engaging with the limiting racks 113 for restriction; in the meantime, the integrated circuit module 30 locating inside the accommodating space 100 with the fastener component 40, thus the at least one side cover 12 connected with the integrated circuit module 30 abutting against a side wall of the main housing 11 and engaging with the buckle part 111 of the main housing 11 for forming a closed configuration;

combining the main housing 11 with the at least one side cover 12 by ultrasonic welding for forming the case 10, thus the assembling of the electronic apparatus of the present invention is accomplished.

The present invention further provides another embodiment of a method for assembling an electronic apparatus, wherein a main difference between the present embodiment and the previous embodiment is that the integrated circuit module 30 is not fixed on the at least one side cover 12 in advance. The steps of assembling of the present embodiment are as following:

passing the cable 20 out from the opening 110 of the case 11;

securing the cable 20 and the integrated circuit module 30 with the fastener component 40 separately, and electrically connecting the cable 20 with the integrated circuit module 30;

embedding the guiding bumps 44 of the fastener component 40 in the at least one guiding rail 112 separately; moving to a position adjacent to the opening 110 of the main housing 11 along the guiding rail 112 and engaging with the limiting racks 113 for restriction; in the meanwhile, the integrated circuit module 30 locating inside the accommodating space 100 with the fastener component 40;

electrically connecting the integrated circuit module 30 with the plugging member 122 of the at least one side cover 12, and abutting the at least one side cover 12 against a side wall of the main housing 11 and engaging with the buckle part 111 for forming a closed configuration;

combining the main housing 11 with the at least one side cover 12 by ultrasonic welding for forming the case 10, thus the assembling of the electronic apparatus of the present invention is accomplished.

Please refer to FIG. 11 to FIG. 14. The present invention further provides an electronic apparatus and a method for assembling thereof. In the present embodiment, the electronic apparatus is described firstly, and then a method of assembling the electronic apparatus is described later. The electronic apparatus includes a case 10', a cable 20', an integrated circuit module 30' and a fastener component 50. The differences between the present embodiment and the aforementioned electronic apparatus will be described, and others will not be described again.

The case 10' includes a main housing 11' having an accommodating space 100' and at least one side cover 12'. In the present embodiment, the main housing 11' is, but not limited to, integrally formed with one open side combined with a side cover 12'. The main housing 11' can also be provided with two open sides combining with two side covers 12', and the method of assembling will be described in detail in the following.

The main housing 11 has a plurality of buckle parts 111' provided in inner walls near the open side, and loading platforms 115' are provided on two sides symmetrically. Besides, an opening 110' is provided in an end away from the open side, and two limiting racks 114 are disposed neighboring the opening 110' symmetrically. The limiting rack 114 comprises a first rib 1141 and a second rib 1142 which are arranged in parallel, wherein the second rib 1142 can be extended slightly in a way from the first rib 1141 to two sides of the main housing 11' for forming, but not limited to, a one-piece rib. The first rib 1141 is provided at least one limiting block 1143 at the corresponding side, and the at least one limiting block 1143 is a bump with an inclined plane at a surface of the first rib 1141. In more detail, the at least one limiting block 1143 is a bump with an inclined plane at a surface of the first rib 1141 and protruded at the open side of the main housing 11' toward the opening 110', wherein the bump with an inclined plane can be, but not limited to, an arcuate ramp or a flat ramp.

The shape and dimensions of the at least one side cover 12' are consistent with the open side of the main housing 11', and a cover-wall 121' is provided at the open side. The cover-wall 121' has a plurality of buckle holes 1210' that have positions and quantity corresponding to the buckle parts 111' of the main housing 11', thus the buckle parts 111' of the main housing 11' can be engaged with the buckle holes 1210. Moreover, plugging member 122' are provided at opposite sides of the cover-wall 121'.

The cable 20' includes a line body 21', a protecting housing 210', a connection portion 22' and a positioning plate 23'. The positioning plate 23' is disposed between the protecting housing 210' and the connection portion 22'. The integrated circuit module 30' includes a circuit board 31' having at least one trough 32' and at least one positioning hole 33' at one side. In more detail, the quantity, locations and dimensions of aforementioned the at least one trough 32' are corresponded to those of the second rib 1142 of the limiting rack 114 for the second rib 1142 can be embedded in the at least one trough 32'.

The fastener component 50 is a seat 51 disposed in the accommodating space 100' and neighboring the opening 111'. The seat 51 has a first fastening portion 52 and a second fastening portion 53. The first fastening portion 52 is provided with two wing-plates 521 and a concave 520 formed there between. The positioning plate 23' of the cable 20' is embedded in the concave 520 tightly for fastening; in further, a close fit is achieved between the positioning plate 23' and the concave 520.

The second fastening portion 53 includes two supporting arms 531 and two second positioning blocks 532 extending from the two supporting arms 531 toward the circuit board 31' respectively, wherein the wing-plates 521 and the supporting arms 531 can be perpendicular to each other, and the supporting arms 531 and the second positioning block 532 can be, but not limited to, perpendicular to each other. In further, the quantity, locations and dimensions of the positioning holes 33' of the aforementioned circuit board 31'are corresponded to the quantity, locations and dimensions of the second positioning block 532. Thus the second positioning blocks 532 can be embedded in the positioning holes 33', and the two supporting arms 531 abut against one surface of the circuit board 31' separately for fixing tightly and forming an upright docking structure with the integrated circuit module 30'. The fastener component 50 is connected with the integrated circuit module 30' by the upright docking structure.

The steps of assembling of the electronic apparatus of the present embodiment are as following:

passing the cable 20' out from the opening 110' of the case 11';

securing the cable 20' and the integrated circuit module 30' with the fastener component 50 separately, and electrically connecting the cable 20' with the integrated circuit module 30';

moving the fastener component 50 inserted with the circuit board 31' and supported by an edge of the circuit board to a position neighboring the opening 110' along the loading platform 115'; the wing-plates 521 slipping smoothly on the limiting block 1143, and one side of the wing-plates 521 abutting against the limiting block 1143 for the fastener component 50 will be restricted between the opening 110' and the limiting block 1143; meanwhile, the integrated circuit module 30' being located inside the accommodating space 100 with the fastener component 50; the at least one side cover 12' and the buckle part 111 of the main housing 11 being engaged with each other for forming a closed configuration; and combining the main housing 11' with the at least one side cover 12' by ultrasonic welding for forming the case 10', thus the assembling of the electronic apparatus of the present invention is accomplished.

The electronic apparatus of the present invention and the method for assembling thereof are provided for fastening the cable 20, 20' and the integrated circuit module 30, 30' simultaneously by the specialized structures of the fastener component 40, 50 corresponding to the cable 20, 20' and the integrated circuit module 30, 30', and the advantages are listed as following:

The overall strength of the product can be improved by the case which is integrally formed.

Ultrasonic welding is applied only in one side to simplify the manufacturing process and improve a yield.

Components of the product disposed inside are fixed before assembling in the case that the reliability of the product can be improved.

The integrated circuit module can be supported and fixed in multi sides by the designed structures of the fastener component and the case. Even the product the product has been dropped by the impact, the integrated circuit module will not detach easily so that it can meet the safety regulatory requirements.

Although the present invention has been described with reference to the preferred embodiment thereof, it will be understood that the invention is not limited to the details thereof. Various substitutions and improvements have been suggested in the foregoing description, and others will occur to those of ordinary skill in the art. Therefore, all such substitutions and improvements are intended to be embraced within the scope of the invention as defined in the appended claims.

What is claimed is:

1. An electronic apparatus, including:
   a case having an accommodating space, and one side of the case having an opening;
   an integrated circuit module disposed in the accommodating space;
   a cable inserted in the opening and electrically connected with the integrated circuit module; and
   a fastener component disposed in the accommodating space and adjacent to the opening, the fastener component comprising:
   a first fastening portion connecting and securing the cable; and
   a second fastening portion connecting and fixing the integrated circuit module,
   wherein the cable has a positioning plate, and the cable is secured in the first fastening portion through the positioning plate.

2. The electronic apparatus according to claim 1, wherein the fastener component is a seat, the first fastening portion is a recess formed on the seat, and the positioning plate is embedded in the recess for fastening the cable.

3. The electronic apparatus according to claim 1, wherein the fastener component is a seat, the first fastening portion includes a front notch and a first positioning block locating at an inner peripheral wall on each of two sides of the first notch; the positioning plate is slidably disposed in the front notch and engaged with the first positioning block for fastening the cable.

4. The electronic apparatus according to claim 1, wherein the fastener component is a seat, the second fastening portion is two supporting arms bending and extending from two sides of the seat respectively, and the two supporting arms are configured corresponding to each other and separately abutted the integrated circuit module on a surface adjacent to the opening.

5. The electronic apparatus according to claim 4, wherein the two supporting arms are bent to each other for forming an inserting slot, the seat has a second positioning block adjacent to the inserting slot; the integrated circuit module has at least one positioning hole formed on an edge thereof adjacent to the opening, and one side of the integrated circuit module is embedded in the inserting slot and abutted against the two supporting arms; the second positioning block and the positioning hole are engaged to each other for fixing the integrated circuit module.

6. The electronic apparatus according to claim 4, wherein the two supporting arms are bent from the seat and extended in a direction away from the opening, and each supporting arm has a second positioning block on a surface where the supporting arm abutting against the integrated circuit module; the integrated circuit module has at least two positioning holes formed on an edge thereof adjacent to the opening, and the second positioning block and the positioning hole are engaged to each other for forming an upright docking structure to fix the integrated circuit module.

7. The electronic apparatus according to claim 1, wherein an inner peripheral wall of the case has provided with a guiding rail; the guiding rail is extended from a side of the case to an opposite side neighboring the opening, and the fastener component is provided with a guiding bump embedded in the guiding rail for the fastener component being capable of moving in the guiding rail.

8. The electronic apparatus according to claim 1, wherein a limiting rack is disposed in the accommodating space adjacent to the opening; the limiting rack is provided with at least one limiting hole, and the fastener component has a limiting block engaging in the at least one limiting hole for securing the fastener component.

9. The electronic apparatus according to claim 1, wherein the case is a cylindrical housing with one open side, and the open side is closed by a side cover.

10. The electronic apparatus according to claim 1, wherein the case has a cylindrical housing with an open side at each of two opposite sides, and each of the open sides is closed by a side cover.

11. A method of assembling an electronic apparatus, wherein the electronic apparatus includes a case having an accommodating space, and one side of the case having an opening; an integrated circuit module disposed in the accommodating space; a cable inserted in the opening and electrically connected with the integrated circuit module; and a fastener component disposed in the accommodating space and adjacent to the opening, the fastener component having a first fastening portion connecting and securing the cable; and a second fastening portion connecting and fixing the integrated circuit module, the method including:
  passing the cable out from the opening of the case;
  securing the cable and the integrated circuit module with the fastener component separately; and
  locating the fastener component to be inside of the accommodating space and to be fastened at a position adjacent to the opening,
  wherein an inner peripheral wall of the case is provided with a guiding rail, and the fastener component is provided with a guiding bump; the fastener component slides in the accommodating space through an engagement of the guiding bump and the guiding rail so that the fastener component is located to be adjacent to the opening.

12. The method for assembling the electronic apparatus according to claim 11, wherein the case includes a main housing and a side cover, one side of the main housing is provided with the opening, and an opposite side is an open side; the cable passes through the open side, and the fastener component is fastened in the main housing;
  after the fastener component is fastened in the case adjacent to the opening, the side cover and the main housing are combined with each other to form a closed configuration through ultrasonic welding process.

* * * * *